United States Patent [19]

Nakagawa

[11] Patent Number: 5,362,583
[45] Date of Patent: Nov. 8, 1994

[54] RETICLE MASK EXPOSURE METHOD COMPRISING BLANK TO REMOVE INCOMPLETE CIRCUITS

[75] Inventor: Koji Nakagawa, Tenri, Japan

[73] Assignee: Sharp Kabushiki Kaisha, Osaka, Japan

[21] Appl. No.: 9,070

[22] Filed: Jan. 26, 1993

[30] Foreign Application Priority Data

Jan. 31, 1992 [JP] Japan .................................. 4-016786

[51] Int. Cl.5 .............................................. G03F 9/00
[52] U.S. Cl. ........................................ 430/5; 430/311; 430/312
[58] Field of Search ...................... 430/5, 22, 269, 311, 430/321, 396, 312

[56] References Cited

FOREIGN PATENT DOCUMENTS

61-226750 of 1986 Japan.
64-38747 of 1989 Japan.

Primary Examiner—Steve Rosasco
Attorney, Agent, or Firm—Nixon & Vanderhye

[57] ABSTRACT

A reticle mask comprising: an exposure pattern for forming a unit for integrated circuits; and a window serving as a blank pattern, said window serving as a blank pattern existing in a region except the exposure pattern; and a method for exposing a pattern for integrated circuits which comprises the steps of: shielding said reticle mask at the exposure pattern for forming the units for integrated circuits; positioning and exposing the blank pattern over an incomplete pattern existing at the periphery of the photoresist film; and removing the exposed incomplete pattern by development.

2 Claims, 7 Drawing Sheets

RETICLE MASK EXPOSURE METHOD COMPRISING BLANK TO REMOVE INCOMPLETE CIRCUITS

BACKGROUND OF THE INVENTION

1. Field of the Invention

This invention relates to a reticle mask and a method for exposing a pattern for integrated circuits using the same. More particularly, it relates to a reticle mask providing an exposure pattern for forming a plurality of integrated circuits and a window serving as a blank pattern, the latter of which can be used to remove an incomplete photoresist pattern which may exist at a periphery region of a semiconductor substrate, thereby improving the yield ratio in the photolithographic method in manufacturing semiconductor integrated circuits.

2. Related Art and Other Consideration

One example of the manufacturing method for semiconductor integrated circuits is illustrated below.

Figure 8A:
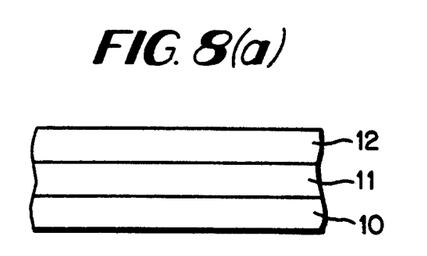
Figure 8B:
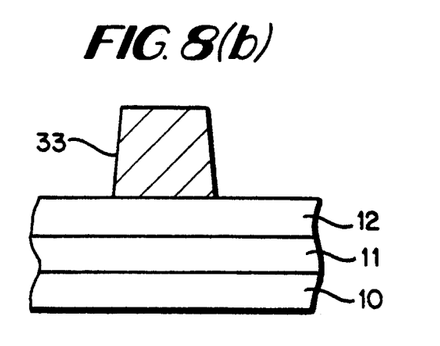

Referring to FIG. 8(a), a $SiO_2$ film 10, a SiN film 11 and a $SiO_2$ film 12 are sequentially stacked on a silicon substrate to form a substrate film 34. Then, the substrate film 34 is covered with a photoresist film, which is followed by exposing and developing a pattern for integrated circuits to form a photoresist pattern 33 (refer to FIG. 8(b)).

Figure 8C:
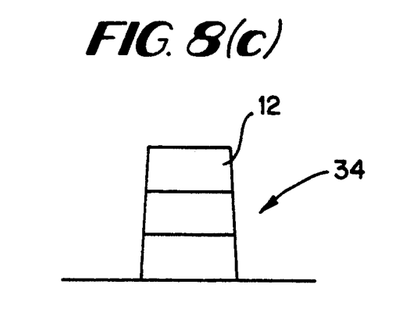

Subsequently, the substrate film 34 is patterned by using the photoresist pattern 33 and a dry etching method (refer to FIG. 8(c)).

Figure 8D:
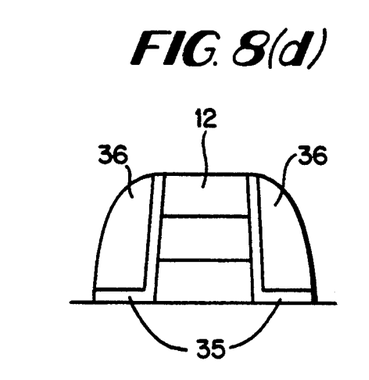

In the next step, a thin SiN film 35 and a thick $SiO_2$ film 36 are sequentially stacked all over the substrate film 34, followed by an etching-back method to form a side wall layer formed of the SiN film 35 and the $SiO_2$ film 36 (refer to FIG. 8(d)).

Following that, the $SiO_2$ films 12 and 36 are removed (refer to FIG. 8(e)), thereby forming a semiconductor integrated circuit.

After coating a photoresist L on a wafer, the photoresist retained in a region on the periphery of a wafer is removed with a thinner. This step is called "edge rinse" (refer to FIG. 14).

Figure 13:
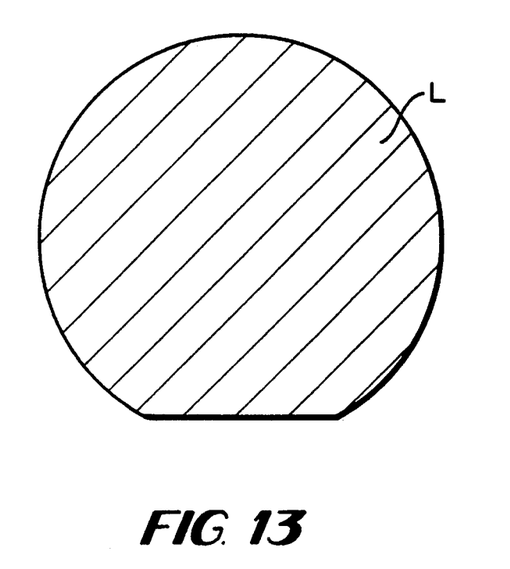
FIG. 13 is a plane view showing a photoresist coated on a wafer as a photoreceptor.
Figure 14:
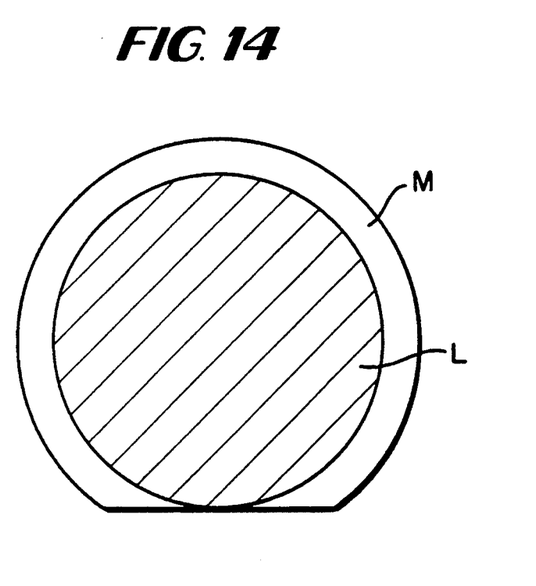
FIG. 14 is a plane view showing a portion on which edge rinse is applied.

Referring to FIGS. 13 and 14, in the edge rinse step, a the photoresist tends to deform at its periphery region M. Because a solvent used in the edge rinse, (for example, a thinner) may remain in admixture with the photoresist at the periphery region M, thickness at the periphery region M may be thinner than that of the other region L. When a mask pattern is transcribed on the photoresist in this state, the resulting photoresist pattern is very likely to collapse at the periphery region M.

Further, when such a collapsed photoresist pattern is used to form the substrate film into a pattern, lift-off failures are very likely to be caused in the process, which produces dusts, resulting in a reduced yield ratio.

The mechanism of reduction in the yield ratio is further explained below.

Figure 12A:
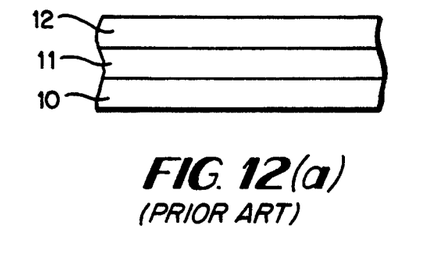
FIG. 12(a) through (e) is a sectional view showing a process for forming a substrate film in a complete chip.

For example, a $SiO_2$ film 10, a SiN film 11, and a $SiO_2$ film 12 are sequentially stacked on a Si substrate to form a substrate film (refer to FIG. 12(a)) in the same manner as shown in FIG. 8(a). This is followed by the formation of a photoresist pattern 13 on the $SiO_2$ film 12 (refer to FIG. 12(b)).

Figure 12B:
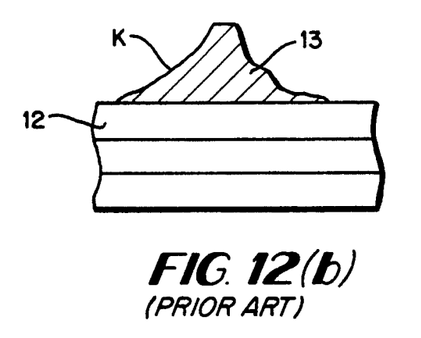
Figure 12C:
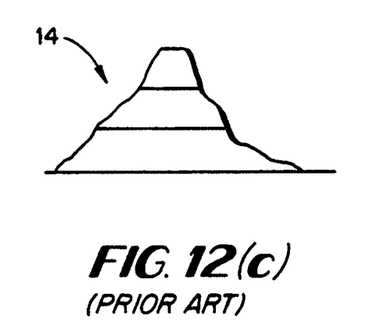

Subsequently, the substrate film 14 is subjected to a patterning step by dry etching (refer to FIG. 12(c)). However, the collapse of the photoresist pattern inhibits the formation of a desired substrate film, which will exert an unfavorable influence upon the subsequent steps.

Figure 12D:
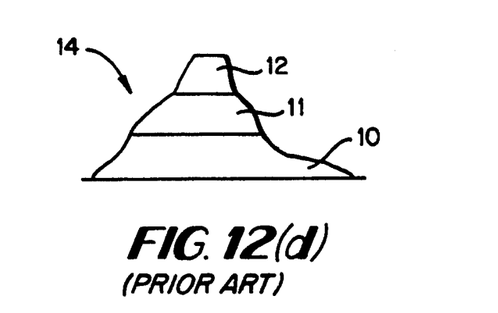

In the next step, a thin SiN film and a thick $SiO_2$ film are sequentially stacked on the Si substrate, and then an etch back process is conducted for forming the side wall layer. However, the absence of a desired shape in the substrate film prevents the SiN film and the $SiO_2$ film from forming a side wall layer all over the side surface of the substrate film 14 (refer to FIG. 12(d)).

Figure 12E:
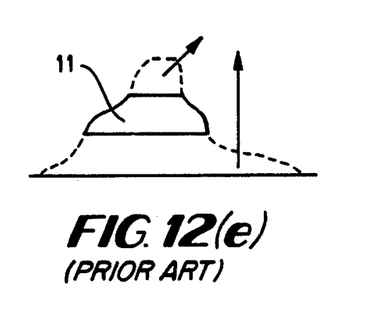

Following the above step, when removing the side wall formed of $SiO_2$, the absence of an offset SiN film 35 (refer to FIG. 8(d)) results in removing the $SiO_2$ film 10, 12 to lift off the SiN film 11, thereby producing dusts (refer to FIG. 12(e)), which reduces the yield ratio of semiconductor integrated circuits.

Figure 15:
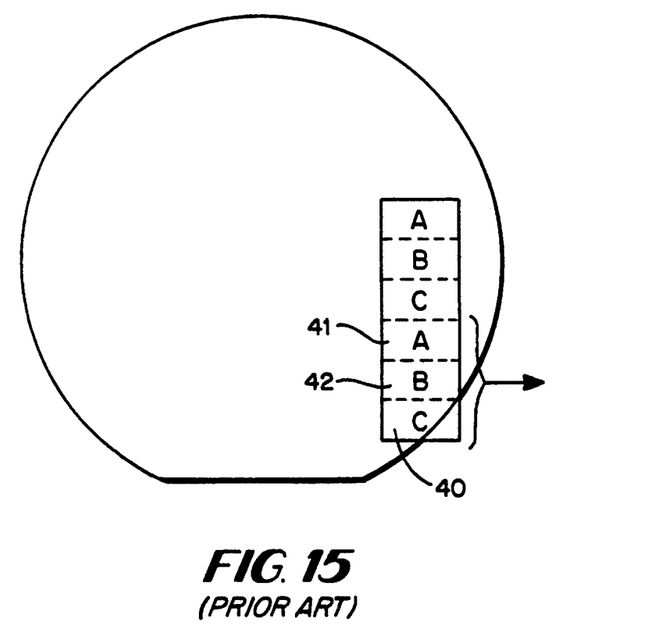
FIG. 15 is a plane view showing a drawback of the prior art.

As described above, in the photolithographic method involved in manufacturing semiconductor integrated circuits, the exposure and the development of circuit pattern will result in the formation of incomplete chips on the periphery of wafers, which induces the collapse and the separation of photoresist patterns to reduce the yield ratio. FIG. 15 shows an example of a wafer in which photoresist patterns are collapsed. Since incomplete integrated circuit chips are formed on the chip C 40 shown in FIG. 15, the collapsed portion K of a photoresist pattern shown in FIG. 12(b) is produced on a wafer edge portion where photoresists are removed with edge rinse. In FIG. 15, a chip A 41 and a chip B 42 are complete while a chip C 40 is incomplete.

Figure 16:
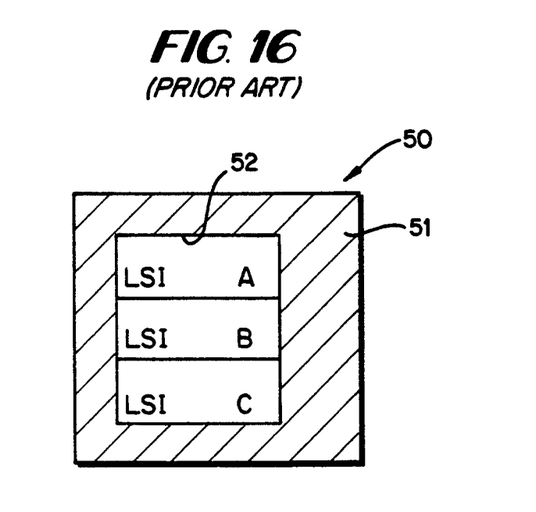
FIG. 16 is a plane view showing a mask used in the prior art.

FIG. 16 shows a mask 50 used in exposing a pattern for forming an integrated circuit shown in FIG. 15. In FIG. 16, reference numeral 51 designates a Cr film forming an exposure window 52 for mutually independent chips A, B and C of integrated circuits.

Figure 11:
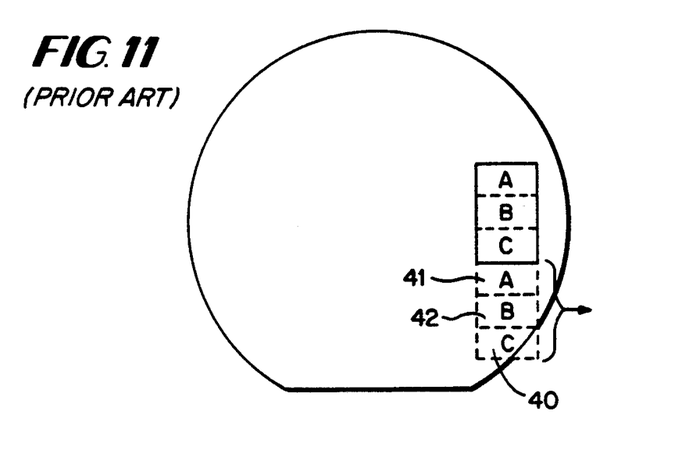
FIG. 11 is a plane view showing a drawback in the prior art.

Removing the chip C 40 which causes the pattern collapse K from a mask on which a plurality of integrated circuit chips are formed requires removing complete chips such as chip A 41 and chip B 42 within the same shot (refer to FIG. 11). Inhibiting the formation of incomplete chips has resulted in the inability of exposing complete units within the same shot on the periphery of wafers, thereby reducing the yield ratio of LSI's.

Japanese Laid-Open Patent No. 226750/1986 and Japanese Laid-Open Patent No. 38747/1989 describe a conventional photomask and an exposure processes using the same.

Japanese Laid-Open Patent No. 226750/1986 discloses a process of reflective projection in the ratio of 1:1 wherein the configuration portion which transmits ultraviolet ray is fixed, which makes it impossible for us to voluntarily concern ourselves with a location where photoresists are removed.

On the other hand, Japanese Laid-Open Patent No. 38747/1989 has a drawback of an inability of removing incomplete chips without reducing the size of the block of unit patterns.

SUMMARY OF THE INVENTION

This invention provides a reticle mask comprising:
an exposure pattern for forming a unit for integrated circuits; and
a window serving as a blank pattern, said window serving as a blank pattern existing in a region except the exposure pattern.

The invention further provides a method for exposing a pattern for integrated circuits which comprises the steps of:

shielding said reticle mask at the exposure pattern for forming the units for integrated circuits;

positioning and exposing the blank pattern over an incomplete pattern existing at the periphery of the photoresist film; and removing the exposed incomplete pattern by development.

BRIEF DESCRIPTION OF THE DRAWINGS

This invention is detailed with respect to the drawings in which:

FIG. 8(a) to (e) is a sectional view of the process for forming a substrate film in a complete unit.

DESCRIPTION OF THE PREFERRED EMBODIMENT OF THE INVENTION

A preferred embodiment of the invention will be detailed by way of the drawings.

Figure 1:
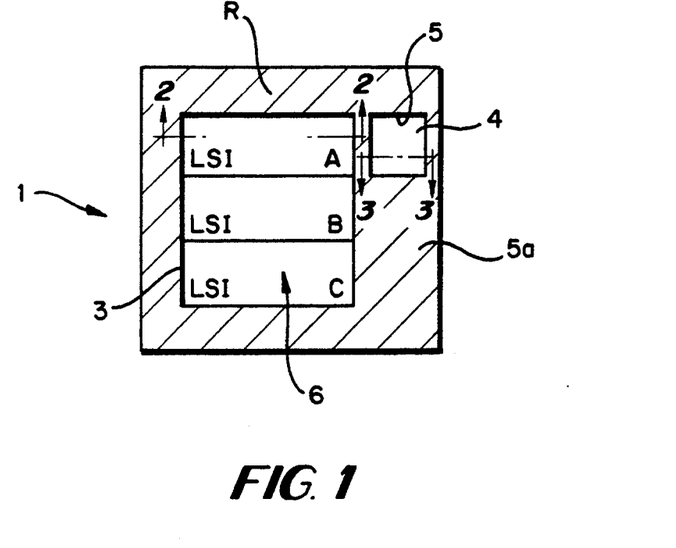
FIG. 1 is a plane view of an embodiment of a mask according to this invention.

Referring initially to FIG. 1, this invention provides a method for exposing a pattern for integrated circuits using a reticle mask 1 (hereinafter referred to as a mask) having a blank pattern window 5 serving as a blank pattern 4 in said mask R comprising a pattern 3 for exposing integrated circuits, which method exhibits the following effects.

(1) The method removes a collapsed portion of a pattern profile, thereby removing the source of dusts.

(2) The method allows a complete removal of incomplete chips, thereby making it possible to form a complete unit which has been removed together with incomplete units to improve the number of completed integrated circuits.

Figure 2:
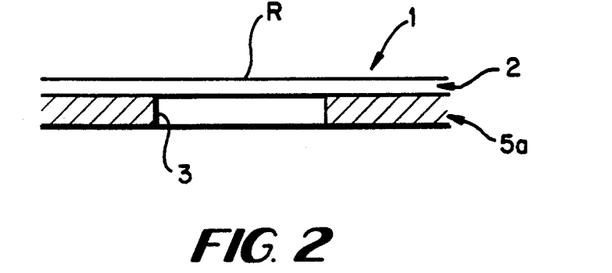
FIG. 2 is a sectional view taken along line I—I' of FIG. 1.
Figure 3:
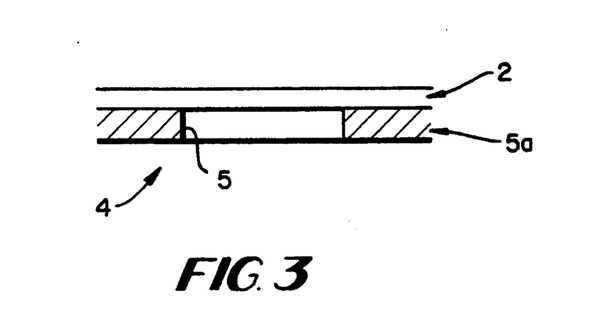
FIG. 3 is a sectional view taken along line II—II' of FIG. 1.

FIG. 1 shows an example of an arrangement of a mask according to this invention. FIG. 2 shows a sectional view taken along I—I' line of FIG. 1. FIG. 3 shows a sectional view taken along II—II' line of FIG. 1.

Referring to FIG. 1, FIG. 2 and FIG. 3, a mask 1 has a Cr film 5a with, for example, a window 5 for exposing a pattern 3 for integrated circuits and for exposing a blank pattern (D) 4 formed on a glass substrate 2. FIG. 1 exemplifies three chip cases as a pattern 3 for exposing integrated circuit patterns. Preferably, they can be appropriately selected depending on the method of exposure. Further, the window 5 for the blank pattern (D) 4 can be provided at a voluntary location on the mask 1.

Figure 9:
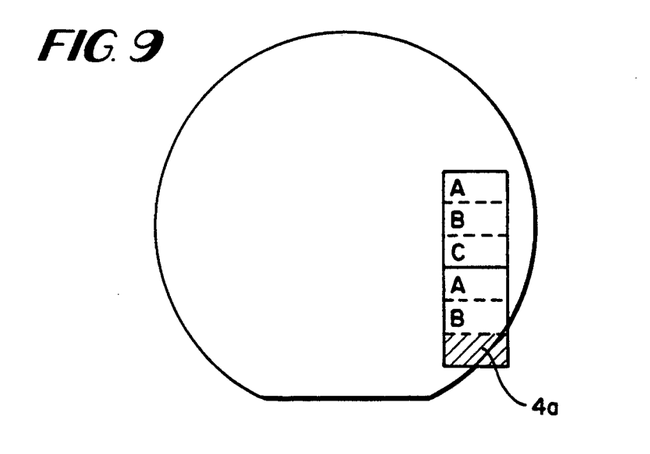
FIG. 9 is a plane view showing a variation of an embodiment of the invention exposing a blank pattern on an incomplete chip.
Figure 10:
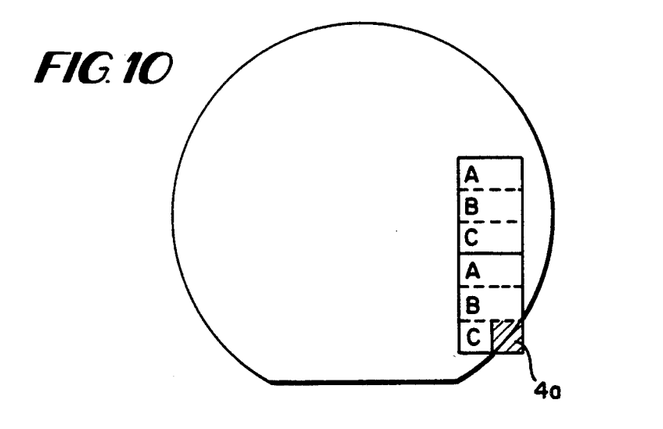
FIG. 10 is a plane view showing a variation of an embodiment of the invention exposing a blank pattern on an incomplete chip.

Removing only an inferior portion of the pattern profile in the incomplete chip C requires setting a blank pattern 4 onto the inferior portion to expose the portion as shown in FIG. 10. Removing the incomplete chip C as a whole requires setting a blank pattern 4 onto the whole incomplete unit C as shown in FIG. 9 to expose the whole chip.

In this way, the window 5 for exposing the blank pattern 4 is directed to a portion where a pattern collapse is produced. A known method of exposing a pattern for integrated circuits can be used, but a reduced reflective exposing apparatus is preferably used for controlling the exposure. Further, the mask is preferably used as an exposure mask in manufacturing an LSI chip.

A method for exposing a pattern for integrated circuits using the above reticle mask is illustrated hereinbelow by way of the drawings.

Figure 4:
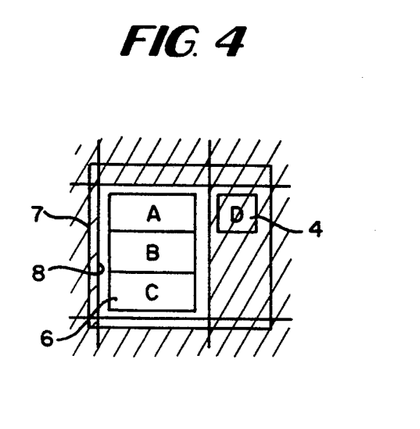
FIG. 4 is a plane view showing a method for exposing a pattern for integrated circuits onto a wafer in an embodiment of this invention.
Figure 5:
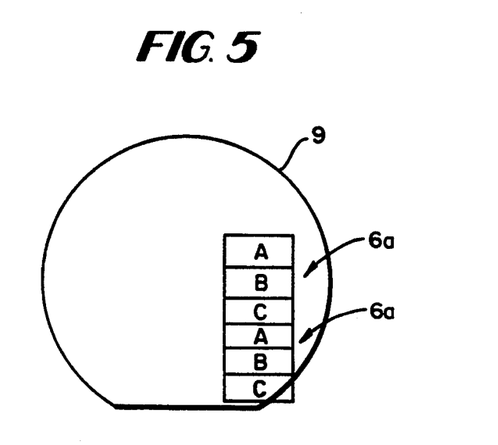
FIG. 5 is a plane view showing an pattern formed on a wafer by exposing a pattern for integrated circuits shown in said embodiment.

(i) Referring to FIG. 4, exposing a pattern for an LSI chip A, an LSI unit B and LSI unit C assumes shielding the blank pattern 4 with a shutter (shaded in FIG. 4) of the exposing apparatus so that only the LSI chip pattern 6 transmits light through a window 8 in the shutter 7 for forming a dozen of shots of LSI patterns 6a on the wafer 9. (Refer to FIG. 5.)

Figure 6:
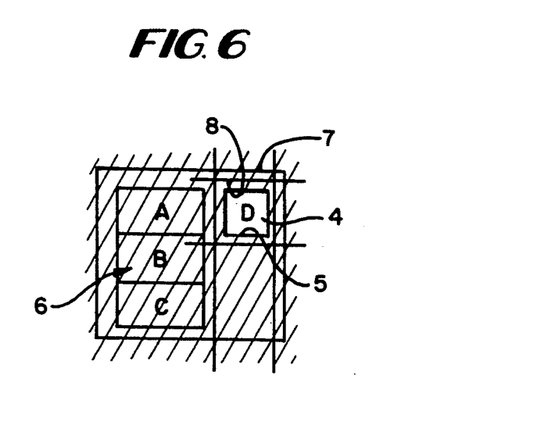
FIG. 6 is a plane view showing a process of exposing a blank pattern in an embodiment of this invention.
Figure 7:
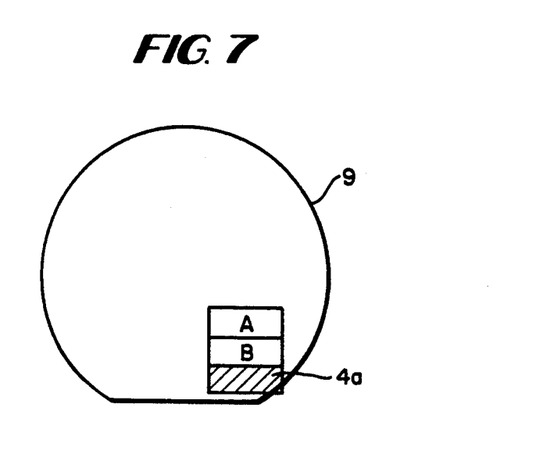
FIG. 7 is a plane view showing a blank pattern after several cycles of exposing a pattern for integrated circuits on an incomplete chip in an embodiment according to this invention.

(ii) Subsequently, exposing a blank pattern 4 as shown in FIG. 6 assumes shielding the pattern 6 in the LSI chip A, LSI chip B and LSI chip C with a shutter 7 so that only the blank pattern 4 transmits light through a window 8 in the shutter 7 for performing several cycles of exposing images on an incomplete chip C around the wafer 9 with a blank pattern 4. Using a positive type photoresist allows the entire region of the pattern exposed by this exposure to be soluble in the developer whereas using a negative type photoresist allows the region to be insoluble in the developer to form a blank pattern (Refer to FIG. 7).

Besides, the size of the window functioning as a blank pattern in the LSI reticle mask comprising a window opening pattern for LSI's depends on the exposure method. When using, for example, a reduced projection-type exposing apparatus for exposure, the size of the window is preferably the same with the exposure pattern of individual LSI chips.

The process for forming a desired substrate film is further detailed by way of FIGS. 8(a) through (e).

Referring to FIG. 8 (a SiO$_2$ film 10, a SiN film 11 and SiO$_2$ film 12 are sequentially stacked to form a substrate film. In the next process, a photoresist pattern 33 is formed on SiO$_2$ film by exposure and development for removing images and photoresist patterns (refer to FIG. 8(b)).

For forming a double side wall by coating a SiN film and a SiO₂ film, a thin SiN film and a thick SiO₂ film are sequentially stacked on an overall surface of the Si substrate including the substrate film 34 for an etch back process. In this process, the substrate film 34 is not formed with the collapse of the photoresist patterns, which does not exert an unfavorable influence upon the following process.

Subsequently, SiO₂ films 12, 36, which fall under an oxide film, are removed (Refer to FIG. 8(e).)

This invention provides a construction having on a mask a window-opening pattern functioning as a blank pattern as well as a window opening pattern for LSI's so as to expose a window-opening pattern on an incomplete chip on the periphery of wafers, thereby removing collapsed photoresist patterns, eliminating failures in the process like lift-offs to improve the yield ratio. Besides, incomplete units on the periphery of wafers increase the completed number of complete chips by eliminating incomplete ones.

What is claimed is:

1. A method for exposing a pattern for integrated circuits which comprises the steps of:

shielding a blank window of a reticle mask, the reticle mask having both the blank window and an exposure pattern for replicating a unit comprising a plurality of integrated circuit chips on a wafer, the blank window being distinct from the exposure pattern, said blank window having a size on the order of the size of an integrated circuit chip of said unit;

exposing the exposure pattern for forming the unit of integrated circuit chips on the wafer;

shielding the exposure pattern of the reticle mask;

positioning and exposing the blank window over an incomplete pattern existing on a photoresist film at a periphery of the wafer; and removing the exposed incomplete pattern by development.

2. The method of claim 1, wherein the step of exposing the exposure pattern is repeatedly executed.

* * * * *